United States Patent
Polo et al.

(10) Patent No.: US 10,250,999 B1
(45) Date of Patent: Apr. 2, 2019

(54) PVT COMPENSATED RESISTIVE BIASING ARCHITECTURE FOR A CAPACITIVE SENSOR

(71) Applicant: Infineon Technologies AG, Neubiberg (DE)

(72) Inventors: Francesco Polo, Arnoldstein (AT); Richard Gaggl, Poertschach am (AT); Benno Muehlbacher, St. Magdalen (AT); Luca Valli, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/706,973

(22) Filed: Sep. 18, 2017

(51) Int. Cl.
| | | |
|---|---|---|
| *H04R 19/04* | (2006.01) | |
| *H04R 3/00* | (2006.01) | |
| *H04R 19/00* | (2006.01) | |

(52) U.S. Cl.
CPC .............. *H04R 19/04* (2013.01); *H04R 3/00* (2013.01); *H04R 19/005* (2013.01); *H04R 2201/003* (2013.01)

(58) Field of Classification Search
CPC ........ H04R 19/04; H04R 19/005; H04R 3/00; H04R 2201/003
USPC .................................. 381/113, 120; 330/174
See application file for complete search history.

(56) References Cited

U.S. PATENT DOCUMENTS

| | | | |
|---|---|---|---|
| 6,580,326 B2 | 6/2003 | Bach et al. | |
| 8,461,903 B1* | 6/2013 | Granger-Jones | H03K 17/04 327/427 |
| 2013/0049867 A1* | 2/2013 | Pinarello | H03F 1/0211 330/277 |
| 2014/0077791 A1* | 3/2014 | Zhang | G05F 3/30 323/314 |
| 2014/0132347 A1* | 5/2014 | Draxelmayr | H03F 3/45183 330/260 |
| 2014/0245034 A1 | 8/2014 | Rotem et al. | |

* cited by examiner

*Primary Examiner* — William A Jerez Lora
(74) *Attorney, Agent, or Firm* — Slater Matsil, LLP (57) ABSTRACT

A circuit for biasing a MEMS microphone includes a first group of serially-coupled transistors coupled between a first node and a second node, a second group of serially-coupled transistors coupled between the first node and the second node, and a voltage divider circuit coupled to the second node having a number of outputs, a first group of outputs being coupled to corresponding control nodes associated with the first group of serially-coupled transistors, and a second group of outputs different from the first group of outputs coupled to corresponding control nodes associated with the second group of serially-coupled transistors, the control nodes being either bulk nodes or gate nodes.

24 Claims, 8 Drawing Sheets

FIG 9

PVT COMPENSATED RESISTIVE BIASING ARCHITECTURE FOR A CAPACITIVE SENSOR

TECHNICAL FIELD

The present invention relates generally to a Process, Voltage, and Temperature (PVT) compensated resistive biasing architecture for a capacitive sensor.

BACKGROUND

Circuits for reading or amplifying signals of capacitive sensors such as a MEMS microphone usually include very high impedance input terminal(s). In such circuits, biasing may also be needed to define a DC operating point for the MEMS microphone. The biasing may use an input component with some characteristic (i.e., linearity and signal symmetry respect to the voltage reference) as well as very high impedance. For example, it may be desirable to design a biasing circuit for a MEMs-based microphone, with impedance values in excess of one GOhm, or even in excess of 100 GOhm.

Commonly proposed biasing solutions use transistors operating in the off-region to supply the required high impedance values. While a high impedance value can in fact be realized, the resultant impedance value may be sensitive to changes in the type of manufacturing Process, operating Voltage, and ambient Temperature (PVT).

SUMMARY

In accordance with an embodiment of the invention, a circuit comprises a first plurality of serially-coupled transistors coupled between a first node and a second node, a second plurality of serially-coupled transistors coupled between the first node and the second node, and a voltage divider circuit in communication with the second node comprising a plurality of outputs, a first group of outputs coupled to corresponding control nodes associated with the first plurality of serially-coupled transistors, and a second group of outputs different from the first group of outputs coupled to corresponding control nodes associated with the second plurality of serially-coupled transistors, the control nodes comprising at least one of bulk nodes or gate nodes.

In accordance with another embodiment of the invention, a circuit comprises a first plurality of serially-coupled transistors coupled between a first node and a second node, a second plurality of serially-coupled transistors coupled between the first node and the second node, a first voltage divider circuit in communication with the second node comprising a plurality of outputs, a first group of outputs coupled to corresponding bulk nodes associated with the first plurality of serially-coupled transistors, and a second group of outputs different from the first group of outputs coupled to corresponding bulk nodes associated with the second plurality of serially-coupled transistors, and a second voltage divider circuit in communication with the second node comprising a plurality of outputs, a first group of outputs coupled to corresponding gate nodes associated with the first plurality of serially-coupled transistors, and a second group of outputs different from the first group of outputs coupled to corresponding gate nodes associated with the second plurality of serially-coupled transistors.

In accordance with another embodiment of the invention, a method of operating a device comprising a first plurality of serially-coupled transistors between a first node and a second node, and a second plurality of serially-coupled transistors between the first node and the second node comprises driving control nodes associated with the first plurality of serially-coupled transistors with a first set of voltages associated with the first and second nodes, and driving control nodes associated with the second plurality of serially-coupled transistors with a second set of voltages associated with the first and second nodes, wherein the control nodes comprise at least one of bulk nodes or gate nodes.

BRIEF DESCRIPTION OF THE DRAWINGS

For a more complete understanding of the invention, and the advantages thereof, reference is now made to the following descriptions taken in conjunction with the accompanying drawings, in which.

DETAILED DESCRIPTION OF ILLUSTRATIVE EMBODIMENTS

Figure 1:
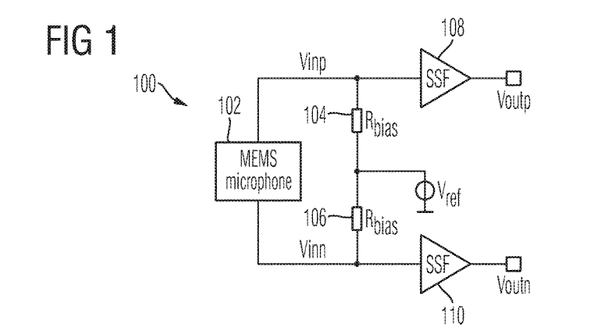
FIG. 1 is a schematic diagram of a read-out system for a MEMS microphone.

FIG. 1 shows a read-out system 100 for a capacitive sensor, such as a MEMS microphone 102 employing constant charge biasing. MEMS microphone 102 uses a very high input impedance to avoid signal degradation. Therefore, the signal input terminals of such a sensor are usually coupled directly to a MOS gate of an amplifying or buffering stage. A super source follower (SSF) may ideally be used for this purpose as is described in co-pending patent application entitled "Systems and Method for Signal Read-Out Using Source Follower Feedback (Ser. No. 15/050,972)", which is hereby incorporated by reference in its entirety. Other known amplifying or buffering stages can also be used. Consequently, read-out system 100 needs a stable and well defined input operating point. As shown in FIG. 1, this can be provided with two high-ohmic biasing resistors 104 and 106, both designated Rbias, respectively coupled between a reference voltage Vref and both input terminals Vinp and Vinn. Biasing resistors 104 and 106 Rbias are related to overall system performance, and define a high pass corner frequency of the system. Biasing resistors 104 and 106 therefore each are in the order of several hundreds of Giga-Ohms to have only little impact on the overall system noise. In circuit embodiments, it is an advantage that resistors 104 and 106 are linear in the presence of a large signal excitation. In some embodiments, the biasing resistors 104 and 106 are symmetric, meaning that the positive signal swing, with respect to the Vref voltage level, should see the same resistance as for a negative signal swing. Symmetric biasing resistors can be used to avoid a drift away from a targeted biasing point. Therefore, embodiments of the invention provide a biasing resistor or resistors with such characteristics as those described above, and with a small variation of resistance value, over PVT voltage, temperature and process variations and to be able to withstand leakage currents occurring in the MEMS device. The leakage currents are caused by parasitic ohmic branches between backplate(s) and a membrane of the MEMS device in, for example, a dusty environment or when the device operates under high humidity conditions as will be explained in further detail below.

Figure 2:
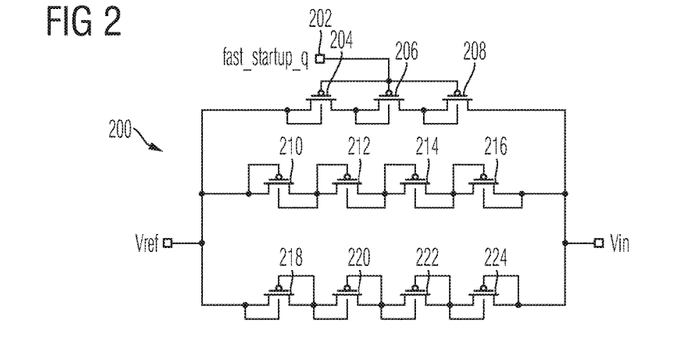
FIG. 2 is a schematic diagram of a high-ohmic biasing resistor without any PVT compensation scheme.

A very high-ohmic biasing resistor can be realized as shown in circuit 200 shown in FIG. 2. Circuit 200 comprises two antiparallel resistor branches of four P-MOS transistors (a first branch includes transistors 210, 212, 214, and 216, and a second branch includes transistors 218, 220, 222, and 224) plus an additional startup switch in parallel, which is made of three P-MOS devices 204, 206, and 208 in series. While P-MOS transistors are shown in FIG. 2, N-MOS transistors can also be used, as well as other types of transistors such as SOI or other technologies. Also, embodiments can be implemented on a monolithic or single semiconductor substrate such as a silicon substrate. During a startup phase the switch is operated in a low-ohmic mode (using switch node 202) to speed up settling time, and after that it is operated in an open mode (using switch node 202). In the illustrated example, every P-MOS device used in the resistor experiences a quarter of the total signal swing. When a positive signal is applied at node Vin, with respect to the reference voltage level Vref, the upper branch decreases the impedance and thus dominates the equivalent resistor. Symmetrically, the lower branch dominates in presence of negative input signals. Ideally the topology in circuit 200 creates a symmetric resistor; otherwise a corresponding biasing point could drift away with the changing signal swing.

Circuit 200 shown in FIG. 2 may have a relatively large spread of the resistance over voltage, temperature and process variations. From a DC point of view, every gate terminal is at the same potential as of the source, which means that a variation of the transistor threshold voltage Vth causes a large resistance variation because of its biasing condition change. For example, at nominal process conditions and in the temperature range of −40° C. to 100° C. four orders of magnitude of resistance variation can be observed. In fact, the resistance drops with decreasing |Vth|, meaning high temperatures and fast processing conditions results in a low resistance. In these conditions, the biasing resistor noise contribution dominates the overall microphone (capacitive sensor) system.

Embodiments of the invention provide a high-ohmic and linear resistance that is compensated over voltage, temperature and process variations, and is tolerant to leakage currents as well (which will be described in further detail below). Embodiments of the invention retain the desirable features of circuit 200 shown in FIG. 2, as well as compensating features for addressing temperature and process variations. Further, leakage currents that may be present with the MEMS device are also addressed.

Figure 3:
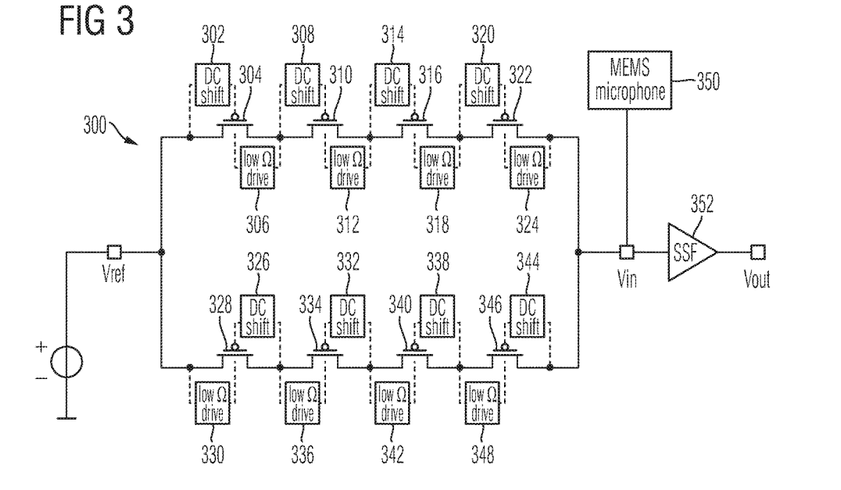
FIG. 3 is a high level schematic diagram of a high-ohmic biasing resistor and associated MEMS microphone and buffer according to an embodiment of the invention.

A high level schematic of a circuit 300 according to an embodiment of the invention, including an impedance circuit, a MEMS microphone 350, and an SSF buffer amplifier 352 is shown in FIG. 3. The impedance circuit comprises a first resistor branch of four P-MOS transistors (304, 310, 316, and 322) in series with a second resistor branch of four P-MOS transistors (328, 334, 340, and 346) in anti-parallel configuration to maintain a symmetric behavior. In some examples each device has a substantially equal portion of the signal swing, which can reduce the effect of the input biasing point drifting over signal swing.

The circuit 300 shown in FIG. 3 ensures firstly a temperature and process compensation and secondly a leakage tolerant approach. To satisfy the first point, circuit 300 applies at the gate of every P-MOS device a proper DC voltage shift temperature and process dependent that compensates the threshold voltage variation of the devices over temperature and process. The DC voltage shifts for the first device branch are shown as DC shift blocks 302, 308, 314, and 320. The DC voltage shifts for the second branch are shown as DC shift blocks 326, 332, 338, and 344. To keep the positive features of the implementation shown in FIG. 2, the DC shift is superimposed to a replica of the drain signal of the respective device. At AC, therefore, the gate signals of circuit 300 are equivalent to the gate signals in circuit 200.

In some embodiments internal leakage current is addressed in order to reduce voltage shifts of the biasing point and to reduce noise. As a consequence, the fast startup switch and its leakage sources shown in FIG. 2 have been removed in the circuit shown in FIG. 3. A short startup time can be achieved by driving the gate of the devices to ground during a startup condition, as is explained in further detail below.

DC shifted replicas of the input voltages, with its divided versions, are therefore used to drive the gates of the P-MOS devices shown in FIG. 3. Furthermore, the gate voltages are ideally set to zero volts (or a gate-source voltage that turns the P-MOS device on fully) during a startup interval. For driving the bulk connections of these devices, low-ohmic replicas of the input voltages, with its divided versions, are used without any voltage shift. The bulk driving circuits for the first resistor branch are shown as blocks 306, 312, 318, and 324 in FIG. 3. The bulk driving circuits for the second resistor branch are shown as blocks 330, 336, 342, and 348 in FIG. 3. Note the anti-parallel configuration of the bulk driving circuits as discussed above with respect to the DC shifting circuits.

Figure 4:
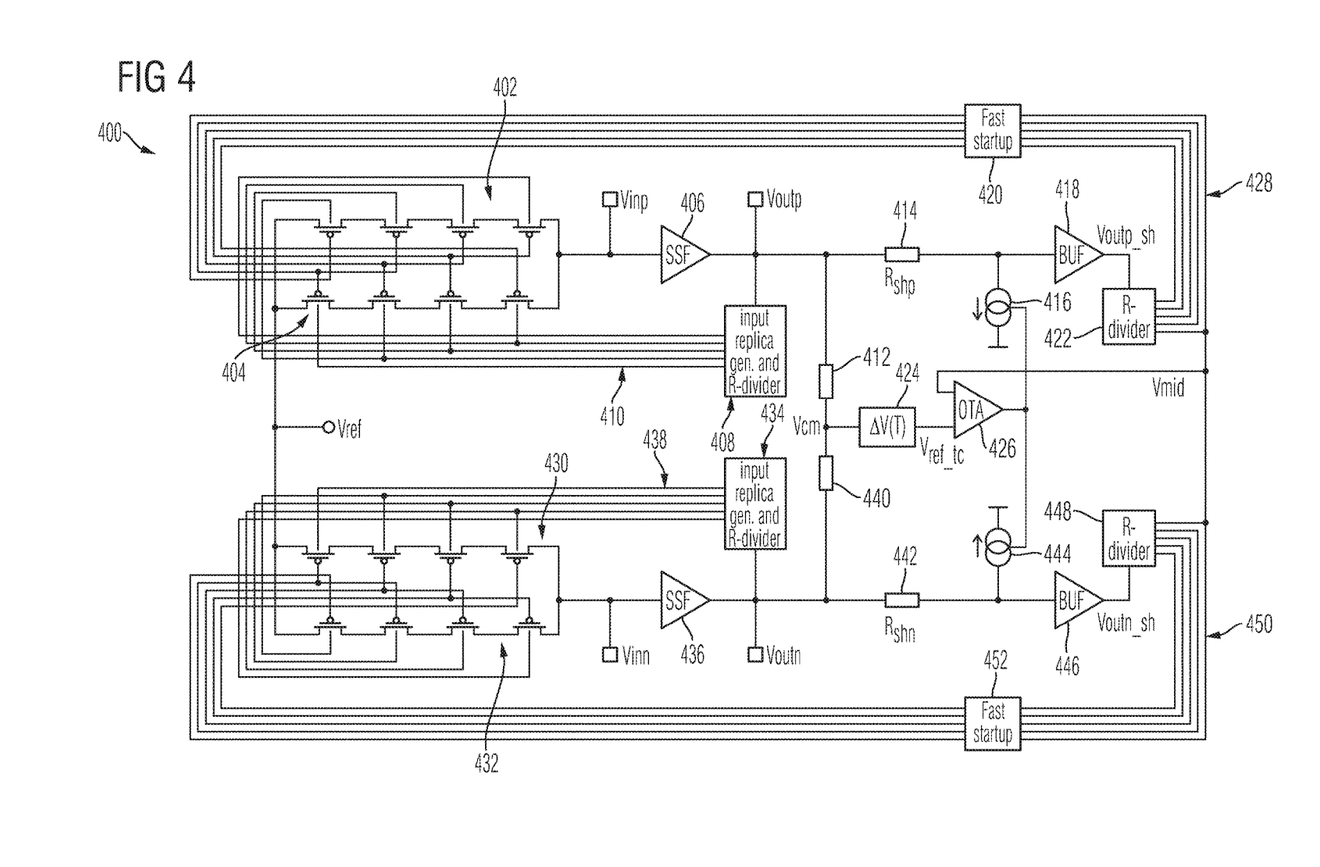
FIG. 4 is a more detailed schematic diagram of a high-ohmic biasing resistor according to an embodiment of the invention.

As shown in FIG. 4, a more detailed implementation 400 of the circuit of an embodiment of the invention is illustrated. Apart from the biasing resistor itself and the super source follower (SSF), there are no additional structures connected to both input terminals Vinp and Vinn. In some embodiments, additional high impedance structures may be coupled to the input terminals, however. The input terminals are the most sensitive nodes in the circuit, since they are high-ohmic. Thus, every device connected to them can lead to leakage, noise, signal attenuation, PSRR degradation, etc. The input replica signals for the bulk terminals and the DC-shifted input replica for the gates are generated from the SSF outputs, Voutp and Voutn, which are low-ohmic driven nodes.

Circuit 400 shown in FIG. 4 thus roughly corresponds to and may be used to implement circuit 300 shown in FIG. 3. The MEMS microphone is not shown in FIG. 4.

An upper half of FIG. 4 includes a first high ohmic resistor including a first branch of transistors 402 in anti-parallel connection with a second branch of transistors 404. Resistor branches 402 and 404 are coupled between a first node, Vref, and a second node Vinp. An SSF buffer 406 is coupled between the Vinp node and the Voutp node. A first voltage divider 408 generates five equally spaced voltages 410 between Voutp and a reference voltage (discussed below), the top four of which are used to drive the bulk terminals in branch 402, and the bottom four of which are used to drive the bulk terminals in branch 404. Voutp is coupled to buffer 418 through intermediary circuitry that will be described below. A second voltage divider 422 coupled to the output of buffer 418 (Voutp_sh) generates five equally spaced voltages 428 between Voutp_sh and Vmid, the top four of which are used to drive the gate terminals in branch 404, and the bottom four of which are used to drive the gate terminals in branch 402. A fast startup circuit 420 coupled to the second voltage divider 422 applies a low impedance across the first high ohmic resistor during startup, which is also discussed in further detail below.

A bottom half of FIG. 4 includes a second high ohmic resistor including a first branch of transistors 430 in antiparallel connection with a second branch of transistors 432. Resistor branches 430 and 432 are coupled between a first node, Vref, and a third node Vinn. An SSF buffer 436 is coupled between the Vinn node and the Voutn node. A first voltage divider 434 generates five equally spaced voltages 438 between Voutn and a reference voltage (discussed below), the top four of which are used to drive the bulk terminals in branch 430, and the bottom four of which are used to drive the bulk terminals in branch 432. Voutn is coupled to buffer 446 through intermediary circuitry that will be described below. A second voltage divider 448 coupled to the output of buffer 446 (Voutn_sh) generates five equally spaced voltages 450 between Voutn_sh and Vmid, the top four of which are used to drive the gate terminals in branch 432, and the bottom four of which are used to drive the gate terminals in branch 430. A fast startup circuit 452 coupled to the second voltage divider 448 applies a low impedance across the second high ohmic resistor during startup, which is also discussed in further detail below.

While voltage dividers 408, 422, 434, and 448 each include equal sized resistors for generating equally spaced voltages, other arrangements of resistors and voltage spacings may be made to accommodate a particular resistor branch configuration.

A common mode feedback loop makes sure that the DC shifted versions of the outputs, Voutp_sh and Voutn_sh, have a desired DC biasing point and a controlled behavior over temperature and process, equal to the node Vref_tc. Vref_tc compensates the threshold voltage variation of the biasing resistor devices. The common mode feedback loop includes resistor 412 coupled between Voutp and Vcm, as well as resistor 440 coupled between Voutn and Vcm. A temperature compensation circuit 424 comprises a temperature dependent voltage generating circuit, the implementation of which is discussed in further detail below. The output of temperature compensation circuit 424 is coupled to an operational transductance amplifier ("OTA") 426 which on turn drives controlled current sources 416 and 444. Current source 416 changes the DC input voltage of buffer 418 by creating an appropriate voltage drop through resistor 414 designated Rshp. Current source 444 changes the DC input voltage of buffer 446 by creating an appropriate voltage drop through resistor 442 designated Rshn. The OTA 426 forces Vmid to be equal to Vref_tc, by controlling the current sources 416 and 444. The result is that Voutp_sh and Voutn_sh have Vref_tc as DC biasing point.

Figure 5A:
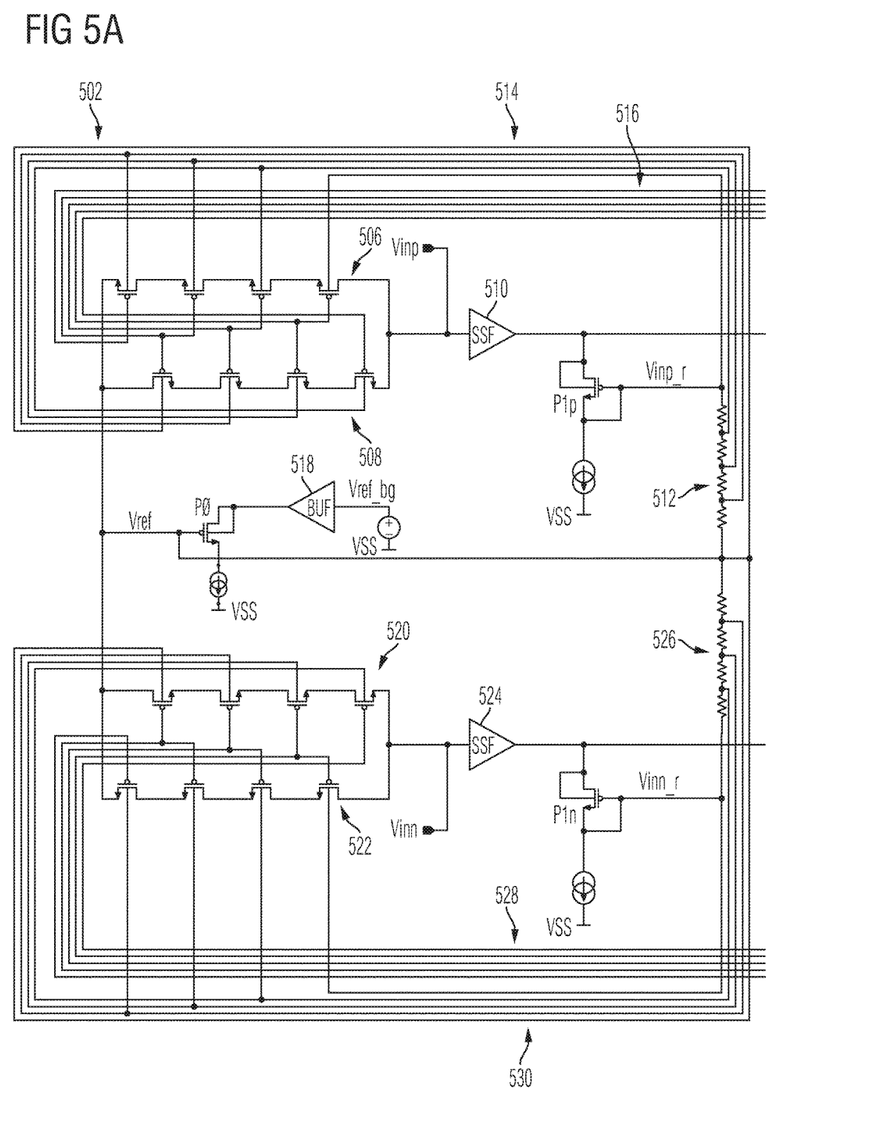
FIGS. 5A and 5B together form a transistor-level schematic diagram of a high-ohmic biasing resistor according to an embodiment of the invention.
Figure 5B:
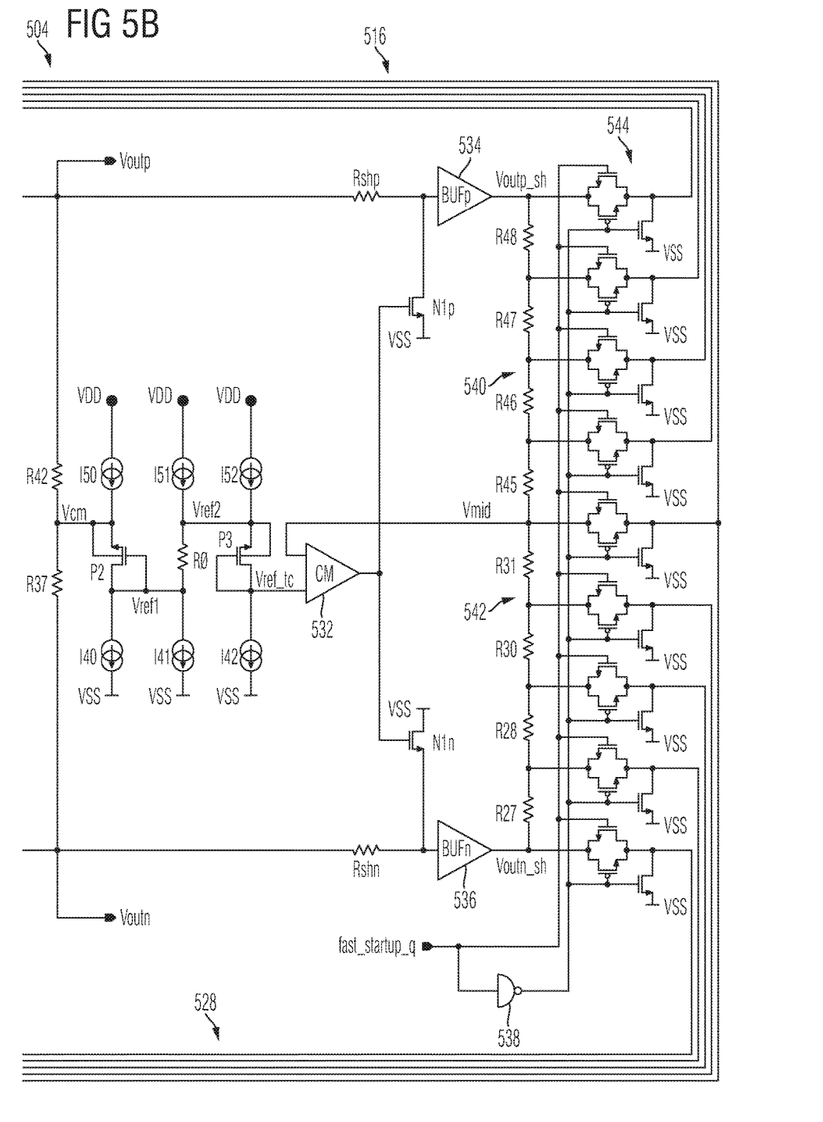

A transistor-level implementation of an embodiment of the invention is shown in FIG. 5A, which includes a first circuit portion 502, and FIG. 5B, which includes a second circuit portion 504. The input reference biasing voltage, Vref, is obtained from a buffered bandgap voltage Vref_bg shifted down by the diode voltage of MOS Transistor (MOST) PØ. MOST PØ is biased through current source 144. The PØ diode voltage is matched with the diode voltage of the source follower input device in SSF circuit 518. The result is that the output biasing voltages are equal to Vref_bg which, being a bandgap voltage, is compensated over temperature, process and voltage. Also the diode voltage of transistors Pip and Pin are matched with the diode voltage of the input device in the source follower and PØ, thus voltages Vinp_r and Vinn_r are low-ohmic replicas of Vinp and Vinn respectively (because they are driven by the two SSF outputs). From Vinp_r and Vinn_r the others bulk voltages are generated via two voltage dividers 512 and 526 comprising four equally sized resistors, which are connected to Vref. Ideally, at DC there will be no current flow through the resistors. The resistors are sized such that the generated voltages are sufficiently low-ohmic to drive any bulk leakage currents. In other words, the leakage currents will cause a negligible voltage drop across the resistive dividers. Voltage divider 512 includes resistors R39, R40, R41, and R43. Voltage divider 526 includes resistors R33, R34, R35, and R36.

Circuit portion 502 also includes a first high ohmic resistor coupled between Vinp and Vref, and includes a first branch 506 and a second branch 508 in anti-parallel connection. First branch 506 includes serially-connected transistors P72, P73, P74, and P75. Second branch 508 includes serially-connected transistors P68, P69, P70, and P71. While P-MOS transistors are shown in branch 506 and 508, N-MOS transistors can also be used, as well as other types of transistors such as SOI or other technologies. Also, embodiments can be implemented on a monolithic or single semiconductor substrate such as a silicon substrate. Furthermore, the number of devices in series and or the number of branches can be arbitrary. The Vinp voltage is buffered through SSF circuit 510, and the Vinn voltage is buffered through SSF circuit 524. Voltage divider 512 generates bulk voltages 514, and voltage divider 526 generates bulk voltages 530. Gate voltages 516 and 528 are also shown in FIG. 5A, and are discussed in further detail below.

Figure 6:
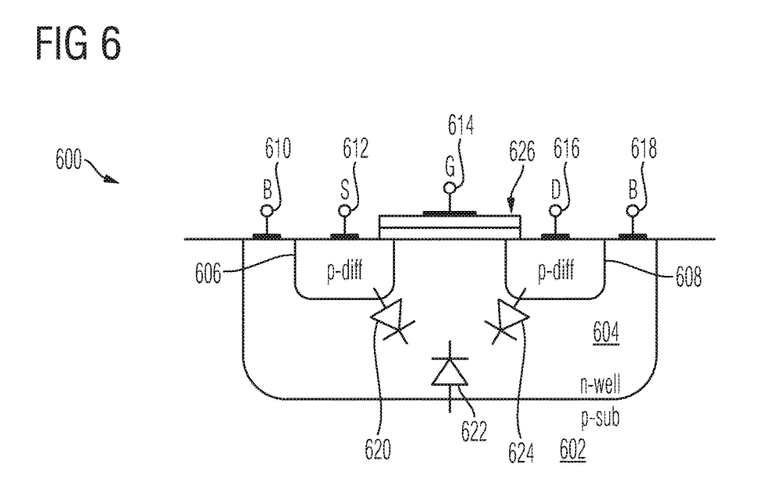
FIG. 6 is a cross-sectional view of a P-MOS transistor used in the circuits of the invention, illustrating possible leakage current paths.

In FIG. 6 a P-MOS transistor 600 cross section is shown. This device is used, in an embodiment, in the biasing resistor as resistive element. A P-substrate 602, N-well 604, source/drain P-diffusions 606 and 608, as well as bulk connections 610 and 618, source connection 612, gate connection 614, and drain connection 616 are shown. Leakage current paths through reverse-biased diodes 620, 622, and 624 are also shown. The gate structure 626 is also shown in FIG. 6.

In particular, the PN junctions between the p-diffusion to n-well and p-substrate to n-well are shown (620, 624, and 622), which might cause leakage currents. Circuit embodiments ensure that these leakage currents are not flowing through the biasing resistor branches. To do so, an embodiment of the invention is implemented, which forces the bulk terminal to be at the same DC potential as the source and drain. Therefore, the leakage currents of the p-diffusion to n-well diodes are largely attenuated. The remaining leakage source, the substrate to n-well diode, is low-ohmically driven and the current is flowing from the bulk to the grounded substrate without entering the resistor branches.

The generation of gate signals is described with reference to circuit portion 504 shown in FIG. 5B. First of all, the output common mode voltage Vcm is obtained using two equal resistors R37 and R42 coupled between voltage nodes Voutp and Voutn. Then Vcm is shifted down by the diode voltage of P2 resulting in the voltage Vref1. P2 is matched with P1p, P1n, PØ and the source follower input device (refer to FIG. 5A). Apparently Vref1 appears to be at the same potential as Vref. This is true in a normal condition. However, the inputs and therefore the outputs might be at a different level due to a shock event, for example. Thus, Vref1 keeps track of the real common mode level. Then Vref1 is shifted up by a current-times-resistance voltage drop across resistors R0, resulting in Vref2. This voltage drop is constant over temperature and process. In terms of temperature and process behavior, Vref2 is equal to Vref applied to the biasing resistance. Finally, a voltage reference Vref_tc is derived that compensates the threshold voltage of the biasing resistor devices. This is done by shifting down Vref2 by a proper diode voltage, P3 and its biasing current is ideally carefully dimensioned to satisfy this requirement. In circuit embodiments, the biasing resistors remain high-ohmic enough not to be the main noise contributor even at high temperature. Furthermore, a small resistor decrease with temperature might be a desired behavior to make the system more robust against additional leakage from ESD structure, MEMS, gate leakage, etc.

The common mode loop makes sure that the voltages Vmid and Vref_tc are substantially equal by controlling the two current sources N1p and N1n. The OTA 532 has a first input for receiving the Vref_tc voltage and a second input for receiving the Vmid voltage. The generated currents together with the resistors Rshp and Rshn are shifting the output voltages by the desired amount, so that Voutp_sh and Voutn_sh have Vref_tc as biasing point. Buffers BUFp 534 and BUFn 536 are used to avoid signal attenuation. Voltage dividers 540 and 542 are then used to do a signal partitioning. Also in these dividers, the resistors are matched and, ideally, there is no DC current flowing. Voltage divider 540 includes resistors R45, R46, R47, and R48 and is used to generate the first set of gate voltages 516 through a startup circuit, which is described in further detail below. Voltage divider 542 includes resistors R27, R28, R30, and R31 and is used to generate the second set of gate voltages 528 through the startup circuit, which is described in further detail below.

Transmission gates and switches to ground are present at every gate signal to have a fast startup time. During startup the transmission gates are opened and the switches are closed, during operation the transmission gates are closed and the switches opened. Driving the gates in the biasing resistance to ground will make the structure low-ohmic allowing a fast settling during startup. The switches to ground include transistors N23, N19, N20, N16, N15, N25, N26, N29, and N30. Corresponding transmission gates include transmission gates T23, T19, T20, T16, T15, T25, T26, T29, and T30. The startup circuit 544 is controlled by the fast_startup_q signal, and by an inverted signal provided by inverter 538.

The biasing resistor value can be trimmed by changing the current through R0, without affecting its behavior over temperature and process. Biasing currents for transistor P2 include I40 and I50. Biasing currents for resistor R0 include I41 and I51. Biasing currents for transistor P3 include I42 and I52.

Some MEMS microphones may exhibit fairly large leakage currents due to, for example, dust and other particles entering the MEMS microphone package. Accordingly, some embodiment biasing circuits have the ability decrease their resistance in the presence of high MEMS leakage currents, making the system more robust in these conditions.

Figure 7:
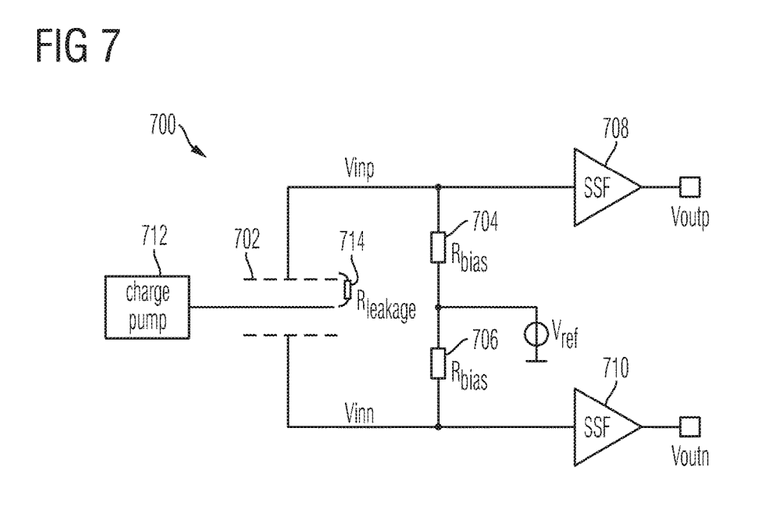
FIG. 7 is a high level schematic diagram of a MEMS biasing circuit including a MEMS leakage path.

In FIG. 7 a MEMS biasing circuit 700 is shown, including a MEMS microphone 702, biasing resistors 704 and 706, SSF circuits 708 and 710, charge pump 712, and leakage path 714. Input terminals Vinp and Vinn, as well as output terminals Voutp and Voutn are also shown. The MEMS microphone 702 is represented with the membrane, connected to the charge pump 712, and the two backplates connected to both input terminals. An on-chip charge pump 712 is providing the desired MEMS biasing voltage. A resistor 714 Rleakage will model a leakage current. The result is that Rleakage with Rbias form a resistive divider, and if Rleakage is low enough to be comparable with Rbias, the input biasing at Vinp will be undesirably shifted up. As a consequence, the biasing at Voutp will follow the input. The worst case is when Rleakage is that small to push the output at the supply level, neglecting any signal swing.

Figure 8A:
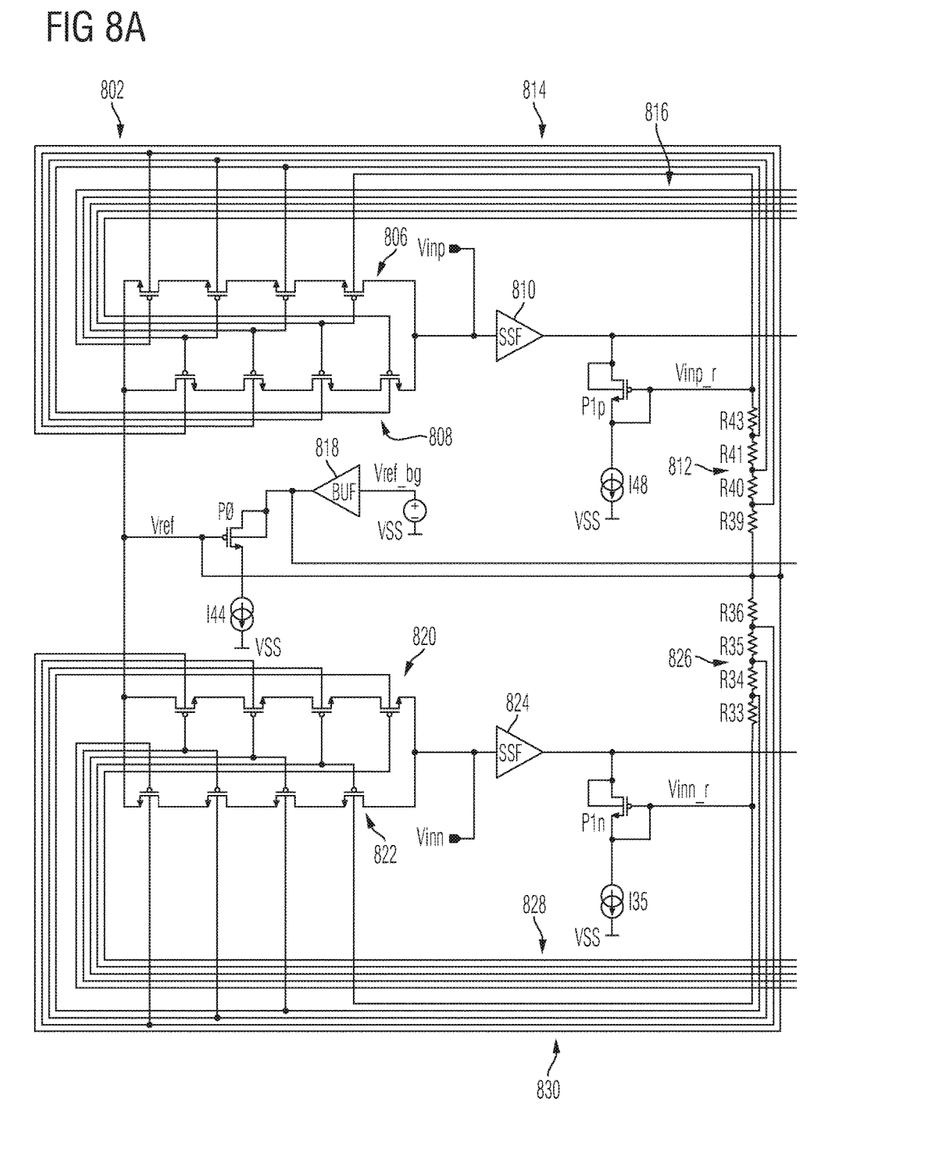
FIGS. 8A and 8B together form a transistor-level schematic diagram of a high-ohmic biasing resistor according to another embodiment of the invention.
Figure 8B:
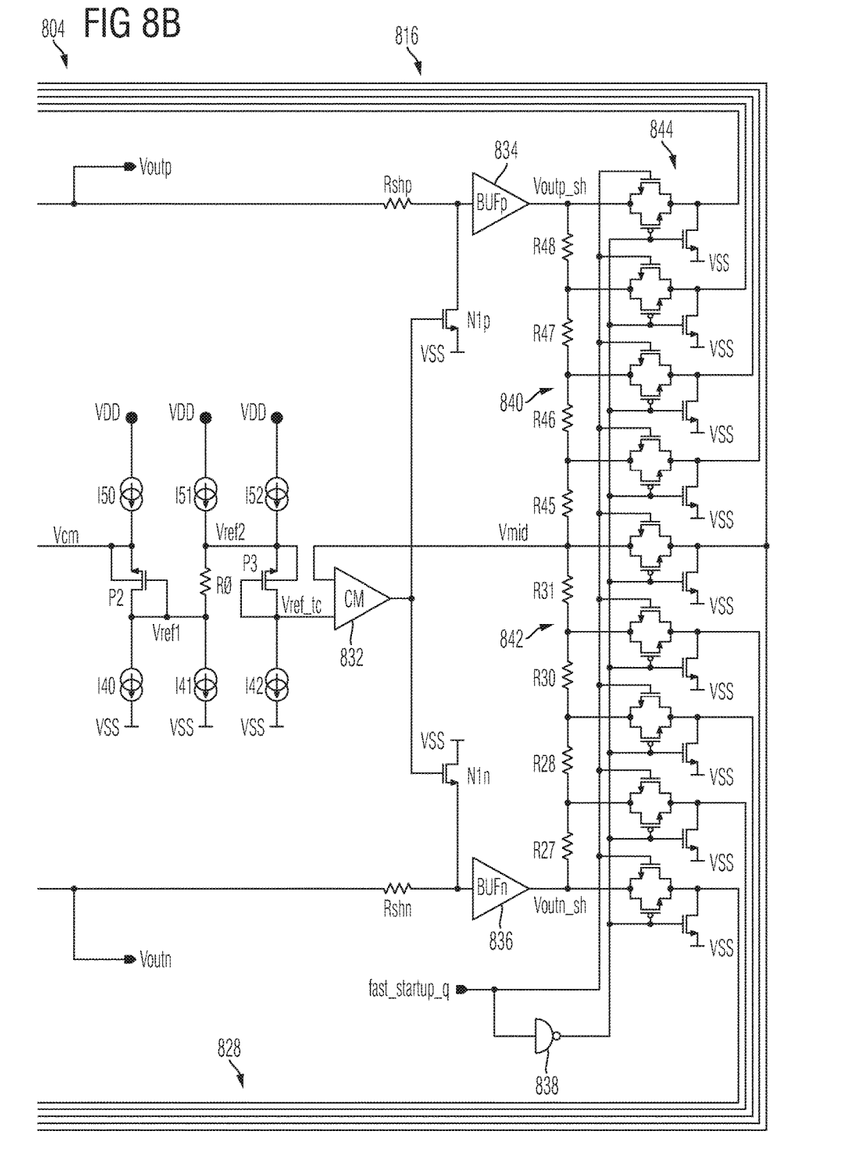

In FIGS. 8A and 8B, circuit portions 802 and 804 provide an alternative embodiment that is more robust with respect to leakage currents in the MEMS microphone. The topology of FIGS. 8A and 8B differs only on the common mode reference voltage Vcm compared to the embodiment shown in FIGS. 5A and 5B. In FIGS. 8A and 8B the Vcm voltage is the buffered bandgap voltage directly; hence Vref1 and Vref are substantially equal independently on the output conditions.

FIG. 8A includes a first circuit portion 802 roughly corresponding to the first circuit portion 502 of FIG. 5A. Thus depicted are resistor branches 806, 808, 820, and 822, buffer circuits 818, 810, and 824, voltage dividers 812 and 826, bulk voltages 814 and 830, and gate voltages 816 and 828. Other components have the same numbering as in FIG. 5A.

FIG. 8B includes a second circuit portion 804 roughly corresponding to the second current portion 504 of FIG. 5B. Thus depicted are buffer and OTA circuits 832, buffer 834 and 836, voltage divider circuits 840 and 842, gate voltages 816 and 828, inverter 838, and startup circuit 844. Other components have the same numbering as in FIG. 5B.

Vref is not used directly since mismatches in current between the two current sources I41 and I51 connected to R0 may change the current through PØ and possibly lead to an error on the output biasing point. Therefore Vcm is used instead, which is a buffered version of the bandgap voltage Vref_bg, as depicted in FIGS. 8A and 8B.

Therefore, a leaky MEMS pushing up one of the outputs will not modify the reference voltage Vref_tc in the common mode loop. In other words, the generated gate voltages are not affected by MEMS leakage. The source, drain and bulk voltages are instead shifted up. Thus, the result is a lower resistance, which in turn means a lower biasing shift. In conclusion, the embodiment shown in FIGS. 8A and 8B may be less affected by MEMS leakage currents than the embodiment shown in FIG. 2.

An advantage of embodiment circuits is that the linearity of input/impedance components is maintained, and any rectifying effects are reduced.

Figure 9:
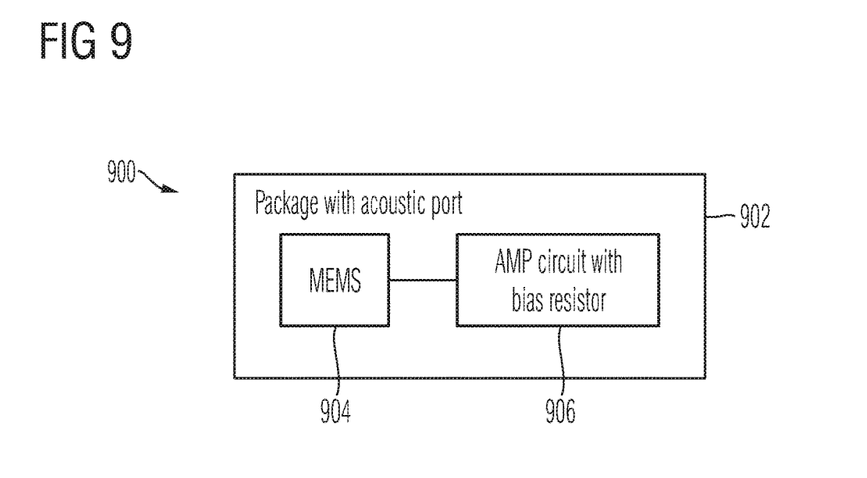
FIG. 9 is a block diagram of a packaged MEMS device including an amplifier circuit according to an embodiment of the invention.

A packaged MEMS microphone 900 is shown in FIG. 9, and includes a package 902 having an acoustic port, a MEMS microphone 904 coupled to an amplifier circuit 906 including biasing resistors according to embodiments of the invention as previously discussed.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
a first plurality of serially-coupled transistors coupled between a first node and a second node;
a second plurality of serially-coupled transistors coupled between the first node and the second node; and
a voltage divider circuit in communication with the second node, the voltage divider circuit comprising a plurality of outputs, a first group of outputs of the plurality of outputs coupled to corresponding control nodes associated with the first plurality of serially-coupled transistors, and a second group of outputs of the plurality of outputs different from the first group of outputs coupled to corresponding control nodes associated with the second plurality of serially-coupled transistors, the control nodes comprising at least one of bulk nodes or gate nodes.

2. The circuit of claim 1, further comprising:
a third plurality of serially-coupled transistors coupled between the first node and a third node;
a fourth plurality of serially-coupled transistors coupled between the first node and the third node; and
an additional voltage divider circuit in communication with the third node, the additional voltage divider circuit comprising a plurality of outputs, a first group of outputs of the plurality of outputs coupled to corresponding control nodes associated with the third plurality of serially-coupled transistors, and a second group of outputs of the plurality of outputs different from the first group of outputs coupled to corresponding control nodes associated with the fourth plurality of serially-coupled transistors, the control nodes comprising at least one of bulk nodes or gate nodes.

3. The circuit of claim 1, comprising an associated impedance between the first and second nodes having a value in excess of one GOhm.

4. The circuit of claim 1, further comprising a MEMS microphone coupled to and biased by the second node.

5. The circuit of claim 1, further comprising a buffer amplifier interposed between the second node and the voltage divider circuit.

6. The circuit of claim 1, wherein the voltage divider circuit comprises a plurality of resistors having substantially the same resistance value.

7. The circuit of claim 1, wherein each output of the first group of outputs is voltage-shifted with respect to the second group of outputs.

8. A circuit comprising:
a first plurality of serially-coupled transistors coupled between a first node and a second node;
a second plurality of serially-coupled transistors coupled between the first node and the second node;
a first voltage divider circuit in communication with the second node, the first voltage divider circuit comprising a plurality of outputs, a first group of outputs of the plurality of outputs coupled to corresponding bulk nodes associated with the first plurality of serially-coupled transistors, and a second group of outputs of the plurality of outputs different from the first group of outputs coupled to corresponding bulk nodes associated with the second plurality of serially-coupled transistors; and
a second voltage divider circuit in communication with the second node, the second voltage divider circuit comprising a plurality of outputs, a first group of outputs of the plurality of outputs coupled to corresponding gate nodes associated with the first plurality of serially-coupled transistors, and a second group of outputs of the plurality of outputs different from the first group of outputs coupled to corresponding gate nodes associated with the second plurality of serially-coupled transistors.

9. The circuit of claim 8, further comprising:
a third plurality of serially-coupled transistors coupled between the first node and a third node;
a fourth plurality of serially-coupled transistors coupled between the first node and the third node;
a third voltage divider circuit in communication with the third node, the third voltage divider circuit comprising a first plurality of outputs coupled to corresponding bulk nodes associated with the third plurality of serially-coupled transistors, and a second plurality of outputs coupled to corresponding bulk nodes associated with the fourth plurality of serially-coupled transistors; and
a fourth voltage divider circuit in communication with the third node, the fourth voltage divider circuit comprising a first plurality of outputs coupled to corresponding gate nodes associated with the third plurality of serially-coupled transistors, and a second plurality of outputs coupled to corresponding gate nodes associated with the fourth plurality of serially-coupled transistors.

10. The circuit of claim 8, comprising an associated impedance between the first and second nodes having a value in excess of one GOhms.

11. The circuit of claim 8, further comprising a MEMS microphone coupled to and biased by the second node.

12. The circuit of claim 8, further comprising a buffer amplifier interposed between the second node and one of the first and second voltage divider circuits.

13. The circuit of claim 8, wherein one of the first and second voltage divider circuits comprises a plurality of resistors having substantially the same resistance value.

14. The circuit of claim 8, further comprising a temperature compensation circuit in communication with the second voltage divider circuit.

15. A method of operating a device comprising a first plurality of serially-coupled transistors between a first node and a second node, a second plurality of serially-coupled transistors between the first node and the second node, a third plurality of serially-coupled transistors coupled between the first node and a third node, and a fourth plurality of serially-coupled transistors coupled between the first node and the third node, the method comprising:
driving control nodes associated with the first plurality of serially-coupled transistors with a first set of voltages associated with the first and second nodes;
driving control nodes associated with the second plurality of serially-coupled transistors with a second set of voltages associated with the first and second nodes,
driving control nodes associated with the third plurality of serially-coupled transistors with a third set of voltages associated with the first and third nodes; and
driving control nodes associated with the fourth plurality of serially-coupled transistors with a fourth set of voltages associated with the first and third nodes,
wherein the control nodes comprise at least one of bulk nodes or gate nodes.

16. The method of claim 15, comprising setting an impedance between the first and second nodes to a value in excess of one GOhms.

17. The method of claim 15 further comprising biasing a MEMS microphone via the second node.

18. The method of claim 15, wherein the first and second sets of voltages each comprise a set of distinct voltage values.

19. The method of claim 15, further comprising generating at least one of the first or second sets of voltages from a low impedance source during a startup mode of operation.

20. A method of operating a device comprising a first plurality of serially-coupled transistors between a first node and a second node, and a second plurality of serially-coupled transistors between the first node and the second node, the method comprising:
- driving control nodes associated with the first plurality of serially-coupled transistors with a first set of voltages associated with the first and second nodes;
- driving control nodes associated with the second plurality of serially-coupled transistors with a second set of voltages associated with the first and second nodes,
- wherein the control nodes comprise at least one of bulk nodes or gate nodes; and
- biasing a MEMS microphone via the second node.

21. The method of claim 20, wherein the device further comprises a third plurality of serially-coupled transistors coupled between the first node and a third node, and a fourth plurality of serially-coupled transistors coupled between the first node and the third node, the method further comprising:
- driving control nodes associated with the third plurality of serially-coupled transistors with a third set of voltages associated with the first and third nodes; and
- driving control nodes associated with the fourth plurality of serially-coupled transistors with a fourth set of voltages associated with the first and third nodes,
- wherein the control nodes comprise at least one of bulk nodes or gate nodes.

22. The method of claim 20, comprising setting an impedance between the first and second nodes to a value in excess of one GOhms.

23. The method of claim 20, wherein the first and second sets of voltages each comprise a set of distinct voltage values.

24. The method of claim 20, further comprising generating at least one of the first or second sets of voltages from a low impedance source during a startup mode of operation.

* * * * *